US009923008B2

(12) United States Patent
Wu et al.

(10) Patent No.: US 9,923,008 B2
(45) Date of Patent: Mar. 20, 2018

(54) WAFER-LEVEL ARRAY CAMERAS AND METHODS FOR FABRICATING THE SAME

(71) Applicant: OmniVision Technologies, Inc., Santa Clara, CA (US)

(72) Inventors: Raymond Wu, Milpites, CA (US); Robbert Emery, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 132 days.

(21) Appl. No.: 14/249,091

(22) Filed: Apr. 9, 2014

(65) Prior Publication Data

US 2014/0306308 A1    Oct. 16, 2014

Related U.S. Application Data

(60) Provisional application No. 61/811,560, filed on Apr. 12, 2013.

(51) Int. Cl.
*H01L 21/00* (2006.01)
*H01L 27/146* (2006.01)

(52) U.S. Cl.
CPC .... *H01L 27/14625* (2013.01); *H01L 27/1469* (2013.01); *H01L 27/14618* (2013.01); *H01L 2924/0002* (2013.01)

(58) Field of Classification Search
CPC .................................. H01L 27/14625
USPC .......................................... 438/65
See application file for complete search history.

(56) References Cited

U.S. PATENT DOCUMENTS

| 8,289,635 | B2 * | 10/2012 | Rossi ............... H01L 27/14621 359/796 |
| 8,865,288 | B2 * | 10/2014 | Bhandari .......... A61M 37/0015 216/11 |
| 9,363,425 | B2 * | 6/2016 | Black .................. H04N 5/2257 |
| 2008/0007623 | A1 | 1/2008 | Lee et al. |
| 2008/0138583 | A1 * | 6/2008 | Bhandari .......... A61M 37/0015 428/156 |

(Continued)

FOREIGN PATENT DOCUMENTS

| TW | 20421863 A | 10/2004 |
| TW | 200421863 A | 10/2004 |
| TW | 201250320 | 12/2012 |

OTHER PUBLICATIONS

Taiwanese Patent Application 10313556 Office Action dated Feb. 18, 2016, 14 pages.

(Continued)

*Primary Examiner* — Telly Green
(74) *Attorney, Agent, or Firm* — Lathrop Gage LLP

(57) ABSTRACT

A wafer-level array camera includes (i) an image sensor wafer including an image sensor array, (ii) a spacer disposed on the image sensor wafer, and (iii) a lens wafer disposed on the spacer, wherein the lens wafer includes a lens array. A method for fabricating a plurality of wafer-level array cameras includes (i) disposing a lens wafer, including a plurality of lens arrays, on an image sensor wafer, including a plurality of image sensor arrays, to form a composite wafer and (ii) dicing the composite wafer to form the plurality of wafer-level array cameras, wherein each of the plurality of wafer-level array cameras includes a respective one of the plurality of lens arrays and a respective one of the plurality of image sensor arrays.

20 Claims, 11 Drawing Sheets

(56) References Cited

U.S. PATENT DOCUMENTS

| | | | | |
|---|---|---|---|---|
| 2008/0290435 A1* | 11/2008 | Oliver | ............. | B29D 11/00375 |
| | | | | 257/432 |
| 2012/0120462 A1* | 5/2012 | Nagata | ................... | G02B 3/005 |
| | | | | 358/475 |
| 2013/0162882 A1* | 6/2013 | Rudmann | ......... | H01L 27/14618 |
| | | | | 348/336 |
| 2013/0265459 A1* | 10/2013 | Duparre | ............. | H04N 5/23238 |
| | | | | 348/218.1 |
| 2014/0160326 A1* | 6/2014 | Black | .................... | H04N 9/045 |
| | | | | 348/262 |

OTHER PUBLICATIONS

Taiwanese Patent Application 10313556 Office Action dated Sep. 18, 2015, 13 pages.

English translation of the 3rd Office Action corresponding to Taiwanese Patent Application No. 103113556, dated Aug. 2, 2016, 2 pages.

First Office Action corresponding to Chinese Patent Application No. 201410148937.3, dated Sep. 1, 2017, with English Translation, 17 pages.

Office Action with English Translation corresponding to Taiwanese Patent Application No. 106100081, dated Sep. 28, 2017, 6 pages.

* cited by examiner

WAFER-LEVEL ARRAY CAMERAS AND METHODS FOR FABRICATING THE SAME

CROSS-REFERENCE TO RELATED APPLICATIONS

The present application claims the benefit of priority from U.S. Provisional Application No. 61/811,560 filed Apr. 12, 2013, which is incorporated herein by reference in its entirety.

BACKGROUND

Wafer-level array cameras are growing in popularity and importance. Wafer-level array cameras may be made for different purposes. Wafer-level cameras may be manufactured with reduced camera height, as compared to a non-wafer-level cameras. Hence, the imaging lens of the wafer-level camera may have a shorter focal length. However, the imaging lens may cover less area in the image plane. To maintain the resolution, i.e., the total number of pixels, an extra lens or several extra lenses may be needed to cover additional area in the image plane. A wafer-level array camera may provide such a solution while maintaining the low camera height, made possible by wafer-level manufacturing, and maintaining a certain number of total pixels covered. In addition, a wafer-level array camera may be aimed for other purposes than to achieve reduced camera height, such as stereo camera functionality, visible and infra red dual camera functionality, array camera having multiple view angles functionality, etc. It is common practice singulate image sensor arrays from an image sensor wafer prior to disposing a wafer-level lens or a wafer-level lens array thereon.

SUMMARY

In an embodiment, a wafer-level array camera includes (i) an image sensor wafer including an image sensor array, (ii) a spacer disposed on the image sensor wafer, and (iii) a lens wafer disposed on the spacer, wherein the lens wafer includes a lens array.

In an embodiment, a method for fabricating a plurality of wafer-level array cameras includes (i) disposing a lens wafer, including a plurality of lens arrays, on an image sensor wafer, including a plurality of image sensor arrays, to form a composite wafer and (ii) dicing the composite wafer to form the plurality of wafer-level array cameras, wherein each of the plurality of wafer-level array cameras includes a respective one of the plurality of lens arrays and a respective one of the plurality of image sensor arrays.

DETAILED DESCRIPTION OF THE EMBODIMENTS

Disclosed herein are wafer-level array cameras and methods for manufacturing the same, which utilize wafer-level assembly of image sensors and lenses prior to singulating the image sensors. This enables a simplified manufacturing process as the number of individual alignment steps are reduced as compared to prior art manufacturing methods. In prior art methods, each image sensor is individually aligned with respect to a corresponding lens. In the presently disclosed methods, an image sensor wafer, generally the wafer on which the image sensors are formed, is aligned with a lens wafer, such that all image sensors of the image sensor wafer are aligned in a single alignment step.

Figure 1:
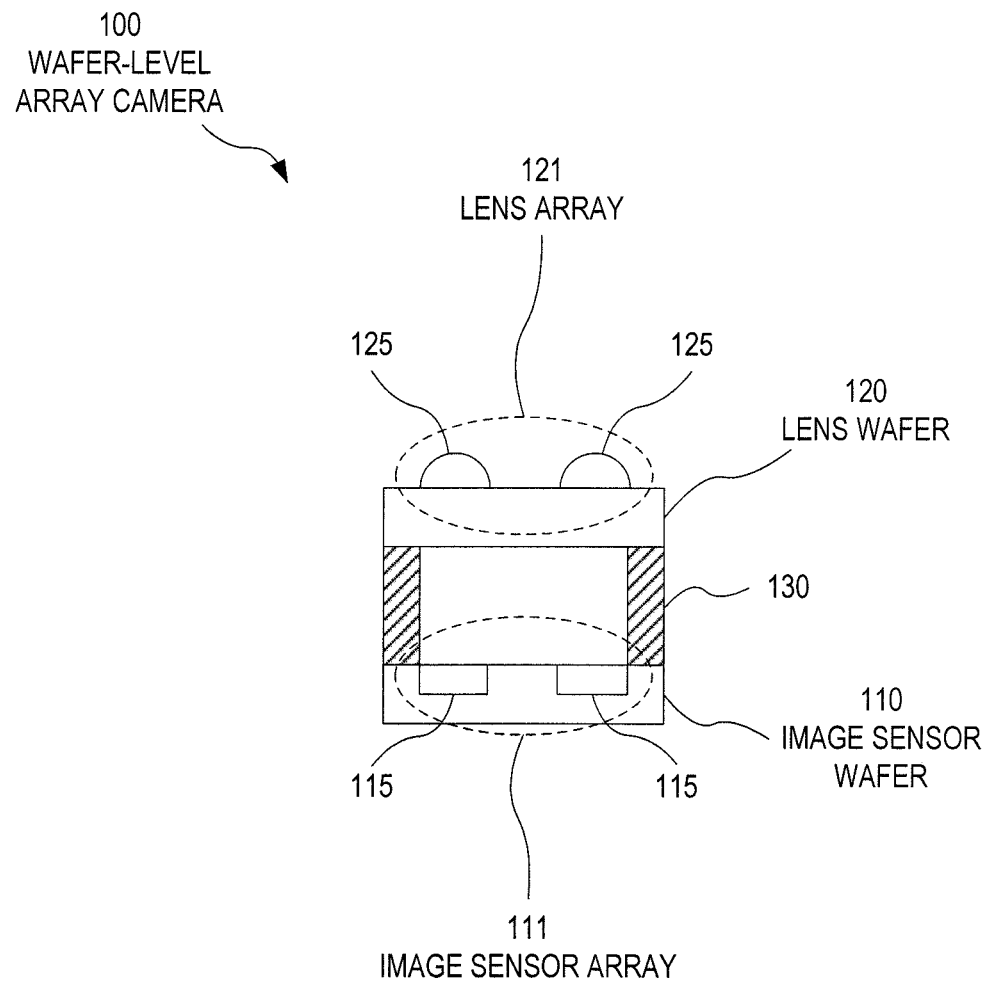
FIG. 1 illustrates a wafer-level array camera, according to an embodiment.

FIG. 1 is a cross sectional view of one exemplary wafer-level array camera 100. Wafer-level array camera 100 includes an image sensor wafer 110 and a lens wafer 120 disposed on image sensor wafer 110. Image sensor wafer 110 includes an image sensor array 111, which in turn includes a plurality of image sensors 115. Lens wafer 120 includes a lens array 121, which in turn includes a plurality of lenses 125. In certain embodiments, lens wafer 120 is positioned with respect to image sensor wafer 110 such that each image sensor 115, together with a respective lens 125, forms an imaging system. Lens wafer 120 is configured such that there is an optical pathway between each pair of lens 125 and image sensor 115. For example, lens wafer 120 may include a clear aperture, for illustrative clarity not shown in FIG. 1, between at least a portion of each of lenses 125 and corresponding image sensor 115. In one embodiment, the optical axis of at least some of lenses 125 intersects respective image sensors 115. In another embodiment, the optical axis of each of lenses 125 intersects a respective image sensor 115. In yet another embodiment, the optical axis of at least some of lenses 125 is centered on respective image sensors 115.

Image sensors 115 are, for example, complementary metal-oxide semiconductor (CMOS) image sensors or charge-coupled device (CCD) image sensors. In certain embodiments, image sensor wafer 110 is at least a portion of the sensor on which image sensors 115 are manufactured. This enables simplified manufacturing of wafer-level array camera 100 as individual image sensors 115 need not be individually aligned with respect to respective lenses 125. It may be sufficient to align image sensor wafer 110 with lens wafer 120. In other embodiments, image sensors 115 are placed, after manufacturing thereof, on a wafer to form image sensor wafer 110. With proper wafer design, this embodiment also allows for alignment of all image sensors 115 in one step by aligning image sensor wafer 110 with lens wafer 120.

In one embodiment, wafer-level camera 100 further includes a spacer 130 disposed between image sensor wafer 110 and lens wafer 120 to define a desired distance between image sensor 110 and lens wafer 120. Spacer 130 is integrally formed or formed from two or more separate elements. Although not shown in FIG. 1, spacer 130 may include material in other areas between image sensor wafer 110 and lens wafer 120. In one example, spacer 130 includes material in the region between the optical path from one lens 125 to its associated image sensor 115 and the optical paths from one or more adjacent lenses 125 to their associated image sensors 115. In another embodiment, not illustrated in FIG. 1, spacer 130 is an integral part of lens wafer 120 and/or image sensor wafer 110.

Although only two image sensors 115 and two lenses 125 are shown in FIG. 1, image sensor wafer 110 may include a larger number of image sensors, without departing from the cross sectional view of FIG. 1. For example, the cross sectional view of FIG. 1 may represent wafer-level array cameras 100, wherein (a) image sensor wafer 110 includes a rectangular image sensor array 111 with 2×N image sensors 115, where N is a positive integer, and (b) lens wafer 120 includes a rectangular lens array 121 with 2×N respective lenses 125, and wherein the cross section is taken along a line passing through one of the N rows of 2 image sensors. Generally, image sensor array 111 and lens array 125 are configured as rectangular arrays of size M×N, where M is a positive integer. Furthermore, image sensors array 111 and lens array 121 may deviate from a rectangular layout, without departing from the scope hereof. For example, image sensor array 111 and lens array 121 may be L- or T-shaped within the plane of image sensor wafer 110 and lens wafer 120, respectively, and/or image sensors 115 and respective lenses 125 may be arranged in non-orthogonal rows and columns within the plane of image sensor wafer 110 and lens wafer 120, respectively.

While FIG. 1 illustrates image sensor wafer 110 as having identical image sensors 115, image sensor wafer 110 may include image sensors of different types, without departing from the scope hereof. In one alternate embodiment, image sensors 115 include at least two different types of image sensors differing from each other in terms of pixel resolution, photosensitivity, color sensitivity, size, and/or shape. Additionally, image sensors 115 may protrude from the surface of image sensor wafer 110 that faces lens wafer 120, or the light receiving surface of image sensor 115 may be recessed in image sensor wafer 110, without departing from the scope hereof.

Similarly, lenses 125 may include lenses, or other optical elements, of different types.

Figure 2:
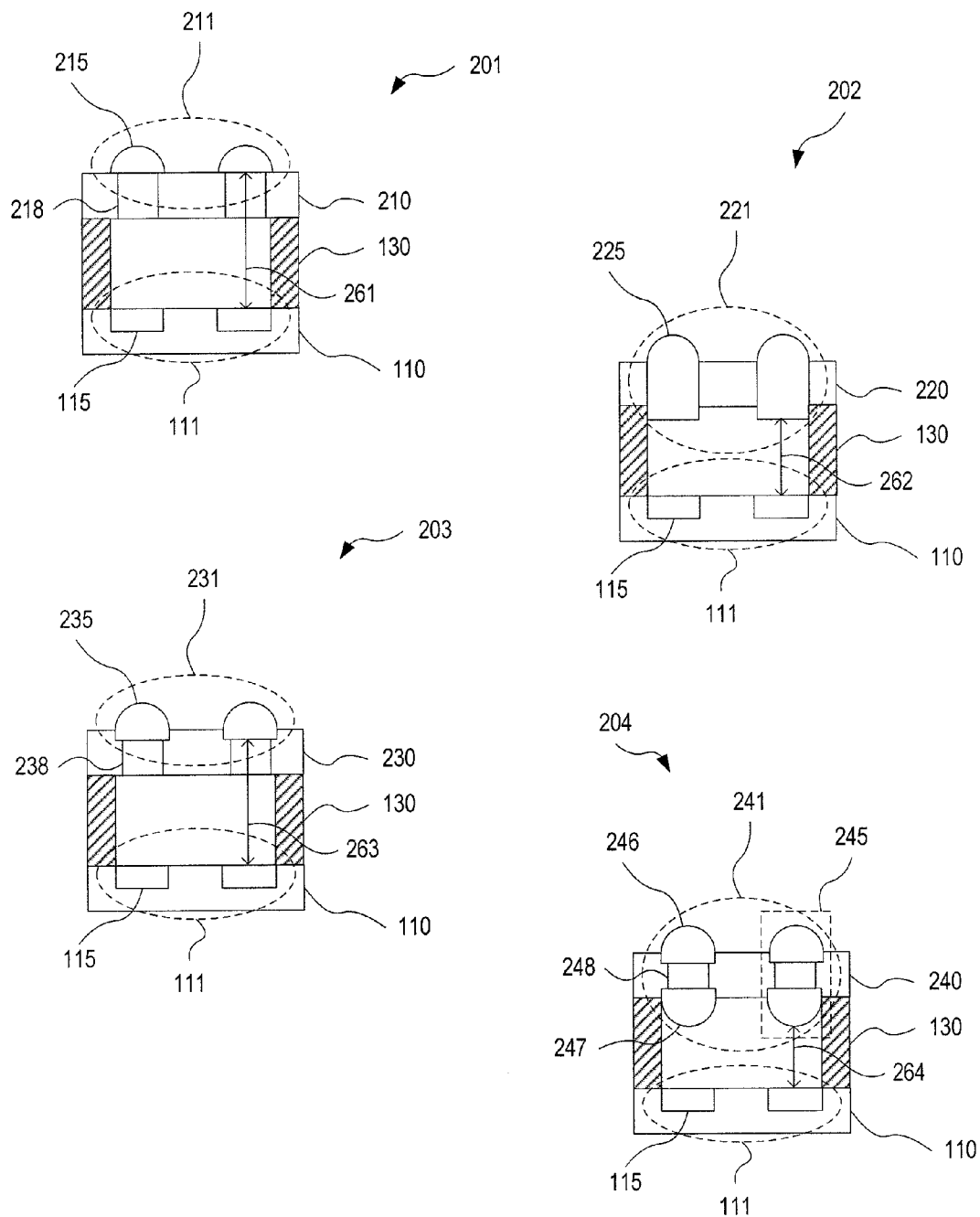
FIG. 2 illustrates exemplary embodiments of the wafer-level array camera of FIG. 1, according to an embodiment.

FIG. 2 illustrates exemplary embodiments 201, 202, 203, and 204 of wafer-level array camera 100. These embodiments exemplify different variations of lens wafer 120. All of wafer-level array cameras 210, 202, 203, and 204 include image sensor wafer 110 and spacer 130. As discussed in connection with FIG. 1, spacer 130 is in certain embodiments formed as an integral portion of image sensor wafer 110 and/or the associated lens wafer.

Wafer-level array camera 201 includes a lens wafer 210, which is an embodiment of lens wafer 120 (FIG. 1). Lens wafer 210 includes a lens array 211 with lenses 215. Lens array 211 and lenses 215 are embodiments of lens array 121 (FIG. 1) and lenses 125, respectively. Lenses 215 are disposed on the surface of lens wafer 210 that faces away from image sensor wafer 110. For each lens 215, lens wafer 210 includes an aperture 218 for providing an optical path way between lens 215 and the corresponding image sensor 115. Aperture 218 may be free of material or be at least partially filled with a material capable of fully or partially transmitting light of a desired wavelength. For example, aperture 218 may be inherently part of lens wafer 210. For illustrative clarity, not all image sensors 115, lenses 215, and apertures 218 are labeled in FIG. 2.

Wafer-level array camera 202 includes a lens wafer 220, which is an embodiment of lens wafer 120 (FIG. 1). Lens wafer 220 includes a lens array 221 with lenses 225. Lens array 221 and lenses 225 are embodiments of lens array 121 (FIG. 1) and lenses 125, respectively. Lenses 225 have thickness greater than the thickness of lens wafer 220 such that lenses 225 extend away from lens wafer 220 both in the direction towards image sensor wafer 110 and in the direction away from image sensor wafer 110. For illustrative clarity, not all image sensors 115 and lenses 225 are labeled in FIG. 2.

Wafer-level array camera 203 includes a lens wafer 230, which is an embodiment of lens wafer 120 (FIG. 1). Lens wafer 230 includes a lens array 231 with lenses 235. Lens array 231 and lenses 235 are embodiments of lens array 121 (FIG. 1) and lenses 125, respectively. Each lens 235 is disposed in a recess or a through hole of the surface of lens wafer 230 that faces away from image sensor wafer 110. For each lens 235, lens wafer 230 includes an aperture 238 for providing an optical path way between lens 235 and the corresponding image sensor 115. Aperture 238 may be free of material or be at least partially filled with a material capable of fully or partially transmitting light of a desired wavelength. For illustrative clarity, not all image sensors 115, lenses 235, and apertures 238 are labeled in FIG. 2.

Wafer-level array camera 204 includes a lens wafer 240, which is an embodiment of lens wafer 120 (FIG. 1). Lens wafer 240 includes a lens array 241 with lenses 245. Lens array 241 and lenses 245 are embodiments of lens array 121 (FIG. 1) and lenses 125, respectively. Each lens 245 is an assembly including a lens 246, disposed in a recess or a through hole of the surface of lens wafer 240 that faces away from image sensor wafer 110, and a lens 247, disposed in a recess or a through hole of the surface of lens wafer 240 that faces image sensor wafer 110. For each lens 245, lens wafer 240 includes an aperture 248 for providing an optical path way between lens 246 and lens 247. Aperture 248 may be free of material or be at least partially filled with a material capable of fully or partially transmitting light of a desired wavelength. For illustrative clarity, not all image sensors 115, lenses 245, lenses 246, lenses 247, and apertures 248 are labeled in FIG. 2.

For the purposes of the present disclosure, a "lens" may be a single lens or a lens assembly, which in addition to lenses may include other optical elements such as a filter, an aperture, an iris, and/or a planar substrate. Additionally, "lens" may refer to optical elements different from lenses, such as a filter, an aperture, an iris, and/or a planar substrate, without departing from the scope hereof. In certain embodiments, the term "lens" refers to a pinhole aperture.

Wafer-level array cameras 201, 202, 203, and 204, as well as wafer-level array camera 100 (FIG. 1), are non-limiting examples of wafer-level array cameras of the present invention. Lens shapes and sizes may differ from those shown in FIGS. 1 and 2, and lenses indicated in FIGS. 1 and 2 may represent other optical elements as discussed above, without departing from the scope hereof. The sizes of apertures 218, 238, and 248 of FIG. 2, in relation to associated lenses 215, 235, 246, and 247, may differ from the illustrations of FIG. 2, without departing from the scope hereof. For example, apertures 218, 238, and 248 may be larger than the clear aperture of associated lenses 215, 235, 247, and 248.

In an embodiment, the distance between image sensor wafer 110 and lens wafer 210, 220, 230, and 240 of wafer-level array camera 201, 202, 203, and 204, respectively, is uniform. In certain embodiments, all lenses of a lens wafer have the same back focal length. The back focal length is the distance between the vertex of the last optical surface of the lens to the rear focal point of the lens, where the last optical surface is the optical surface with the shortest optical distance to the image sensor, and the rear-focal point is on the optical downstream side of the lens. For example, all lenses 215 of lens wafer 210 have substantially identical back focal length 261, all lenses 225 of lens wafer 220 have substantially identical back focal length 262, all lenses 235 of lens wafer 230 have substantially identical back focal length 263, and all lenses 245 of lens wafer 240 have substantially identical back focal length 264. In the present disclosure "same back focal length" or "substantially identical back focal length" refers to back focal lengths being identical to within manufacturing tolerances. Spacer 130 may be sized according to the back focal length 261, 262, 263, and 264, for wafer-level cameras 201, 202, 203, and 204, respectively, such that the rear focal point coincides with the light-receiving surface of image sensors 115 and an optimally focused image is produced.

Figure 3:
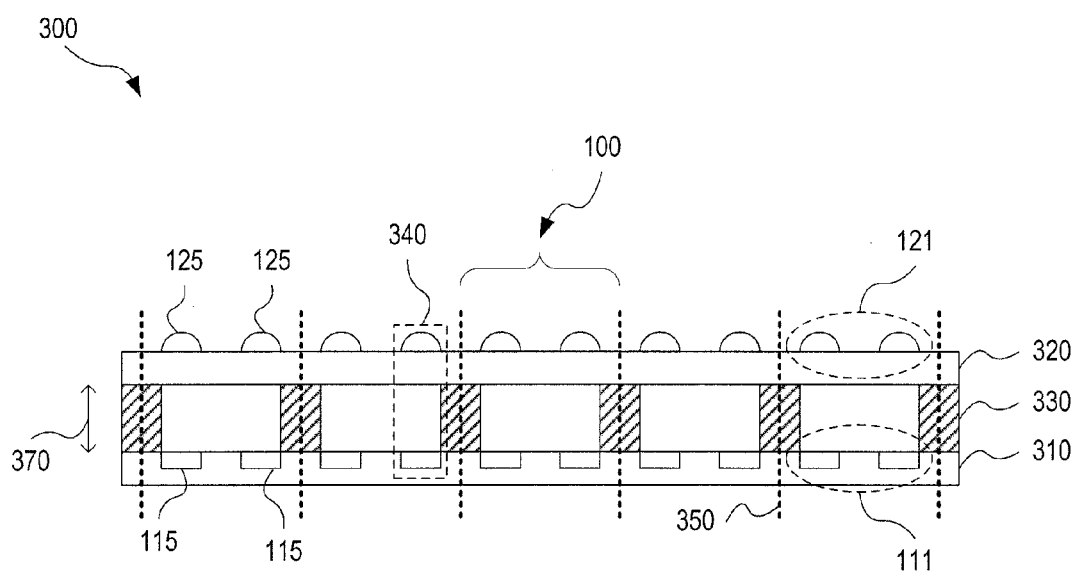
FIG. 3 illustrates a composite wafer, including an image sensor wafer and a lens wafer, from which a plurality of wafer-level array cameras may be formed, according to an embodiment.

FIG. 3 is a cross sectional view of one exemplary composite wafer 300 from which a plurality of wafer-level array cameras 100 (FIG. 1) may be formed. Composite wafer 300 includes an image sensor wafer 310 and a lens wafer 320 disposed thereon using a spacer 330. As discussed in connection with FIG. 1, spacer 330 may be integrally formed as a portion of image sensor wafer 310 and/or lens wafer 320. Image sensor wafer 310 includes a plurality of image sensor arrays 111 (FIG. 1). Lens wafer 320 includes a plurality of lens arrays 121 (FIG. 1). For illustrative clarity, not all image sensor arrays 111 and lens arrays 121 are labeled in FIG. 3. Lens wafer 320 is aligned with respect to image sensor wafer 310 such that at least some of lenses 125 are aligned with respective image sensors 115. In an embodiment, mutually aligned pairs of a lens 125 and a respective image sensor 115 form imaging systems 340. In one embodiment, the optical axis of at least some of lenses 125 intersects respective image sensors 115. In another embodiment, the optical axis of at least some of lenses 125 is centered on respective image sensors 115.

Composite wafer 300 may be diced, or otherwise cut, along dicing lines 350 to form a plurality of wafer-level array cameras 100 (FIG. 1), i.e., to cingulate wafer-level array cameras 100 (FIG. 1). For illustrative clarity, only one dicing line 350, one wafer-level array camera 100, and one imaging system 340 are labeled in FIG. 3. Dicing lines 350 may pass through material portions of spacer 330, as illustrated in FIG. 3, and/or other portions of composite wafer 300. The portion of spacer 330 included in a single wafer-level array camera 100 is spacer 130 (FIG. 1). The portion of image sensor wafer 310 included in a single wafer-level array camera 100 is image sensor wafer 110 (FIG. 1), and the portion of lens wafer 320 included in a single wafer-level array camera 100 is lens wafer 120 (FIG. 1).

In certain embodiments, spacer 330 is configured to define a uniform distance 370 between image sensor wafer 310 and lens wafer 320. For example, in embodiments where all lenses 125 of lens wafer 320 have the same back focal length, distance 370 may be such that the rear focal point of lenses 125 coincides with the light receiving surface of corresponding image sensors 115 of image sensor wafer 310.

In one embodiment, image sensor wafer 310 is at least a portion of the sensor on which image sensors 115 are manufactured. This enables simplified manufacturing of wafer-level array cameras 100 as individual image sensors 115 need not be individually aligned with respect to respective lenses 125. It may be sufficient to align image sensor wafer 310 with lens wafer 320 in a single step. In other embodiments, image sensors 115 are placed, after manufacturing thereof, on a wafer to form image sensor wafer 310. With proper wafer design, this embodiment also allows for alignment of all image sensors 115 in one single step by aligning image sensor wafer 310 with lens wafer 320.

Although FIG. 3 shows five wafer-level array cameras 100, composite wafer 300 may be shaped and sized for forming a different number of wafer-level array cameras 100, without departing from the cross sectional view of FIG. 3. For example, the cross sectional view of FIG. 3 may represent a composite wafer 300 for forming 5×N' wafer-level array cameras 100, where N' is a positive integer. Generally, composite wafer 300 may be configured for forming M' wafer-level array cameras 100, where M' is a positive integer, without departing from the scope hereof. In the special case, where M' is one, dicing lines 350 may be omitted and composite wafer 300 is wafer-level array camera 100. In one embodiment, the plurality of image sensor arrays 111 and the plurality of lens arrays 121 are arranged along rows and columns. This enables straight dicing lines 350 for forming wafer-level array cameras 100. For example, the plurality of image sensor arrays 111 and the plurality of lens arrays 121 are arranged along orthogonal rows and columns, and dicing lines 350 are orthogonal dicing lines. In certain embodiments, lenses 125 of lens wafer 320 are arranged in the same pattern as respective image sensors 115 of image sensor wafer 310.

Figure 4:
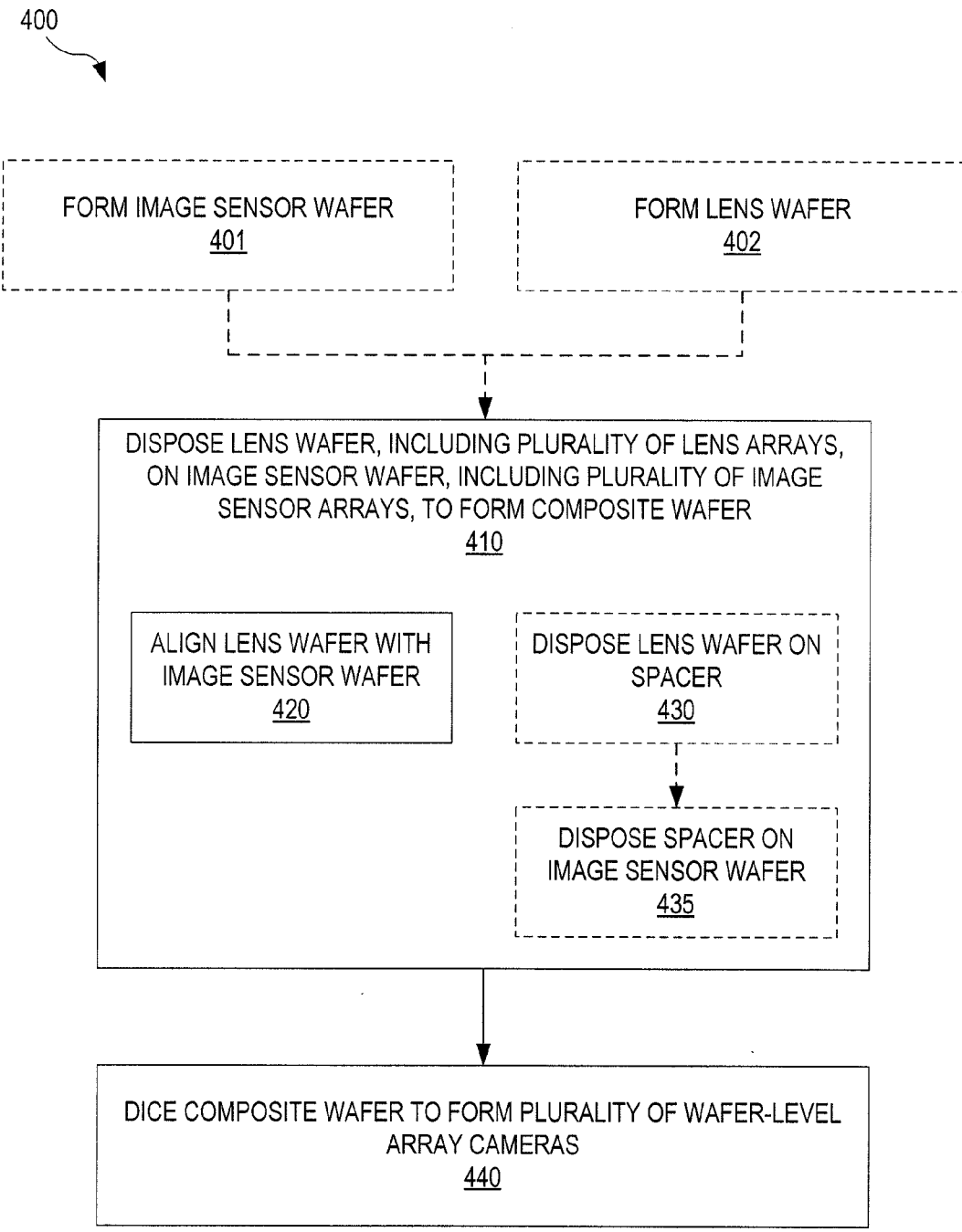
FIG. 4 illustrates a method for manufacturing a plurality of wafer-level array cameras, according to an embodiment.

FIG. 4 illustrates one exemplary method 400 for manufacturing a plurality of wafer-level array cameras, such as wafer-level array camera 100 of FIG. 1. In a step 410, a lens wafer, including a plurality of lens arrays, is disposed on an image sensor wafer, including a plurality of image sensor arrays, to form a composite wafer. For example, lens wafer 320 (FIG. 3) is disposed on image sensor wafer 310 (FIG. 3) to form composite wafer 300. Step 410 includes a step 420, wherein the lens wafer is aligned with the image sensor wafer. For example, in the process of disposing lens wafer 320 (FIG. 3) on image sensor wafer 310 (FIG. 3), lens wafer 320 is aligned such the positions of lenses 125 in the plane of composite wafer 300 are substantially identical to the positions of respective image sensors 115, to within manufacturing tolerances.

Step 410 may further include a step 430 of disposing the lens wafer on a spacer, followed by a step 435 of disposing the spacer on the image sensor wafer. For example, lens wafer 320 (FIG. 3) is disposed on spacer 330 (FIG. 3), which is then disposed on image sensor wafer 310 (FIG. 3). The order of steps 430 and 435 may be reversed, without departing from the scope hereof.

In a step 440, the composite wafer formed in step 410 is diced to form a plurality of wafer-level array cameras. For example, composite wafer 300 of FIG. 3 is diced along dicing lines 350 to form a plurality of wafer-level array cameras 100 (FIG. 1), as indicated in FIG. 3.

In an embodiment, step 440 is omitted such that method 400 forms a single wafer-level array camera. For example, method 400 may form a single wafer-level array camera 100 (FIG. 1), using only step 410.

Optionally method 400 includes steps 401 and/or 402 performed prior to step 410. In optional step 401, the image sensor wafer used in step 410 is formed. For example, image sensors 115 (FIGS. 1 and 3) are manufactured on a wafer to form image sensor wafer 310 (FIG. 3). In another example, image sensors 115 (FIGS. 1 and 3) are placed, after manufacturing thereof, on a wafer to form image sensor wafer 310 (FIG. 3). In optional step 402, the lens wafer used in step 410 is formed. For example, lenses 125 (FIGS. 1 and 3) are manufactured on a wafer to form lens wafer 320.

Figure 5:
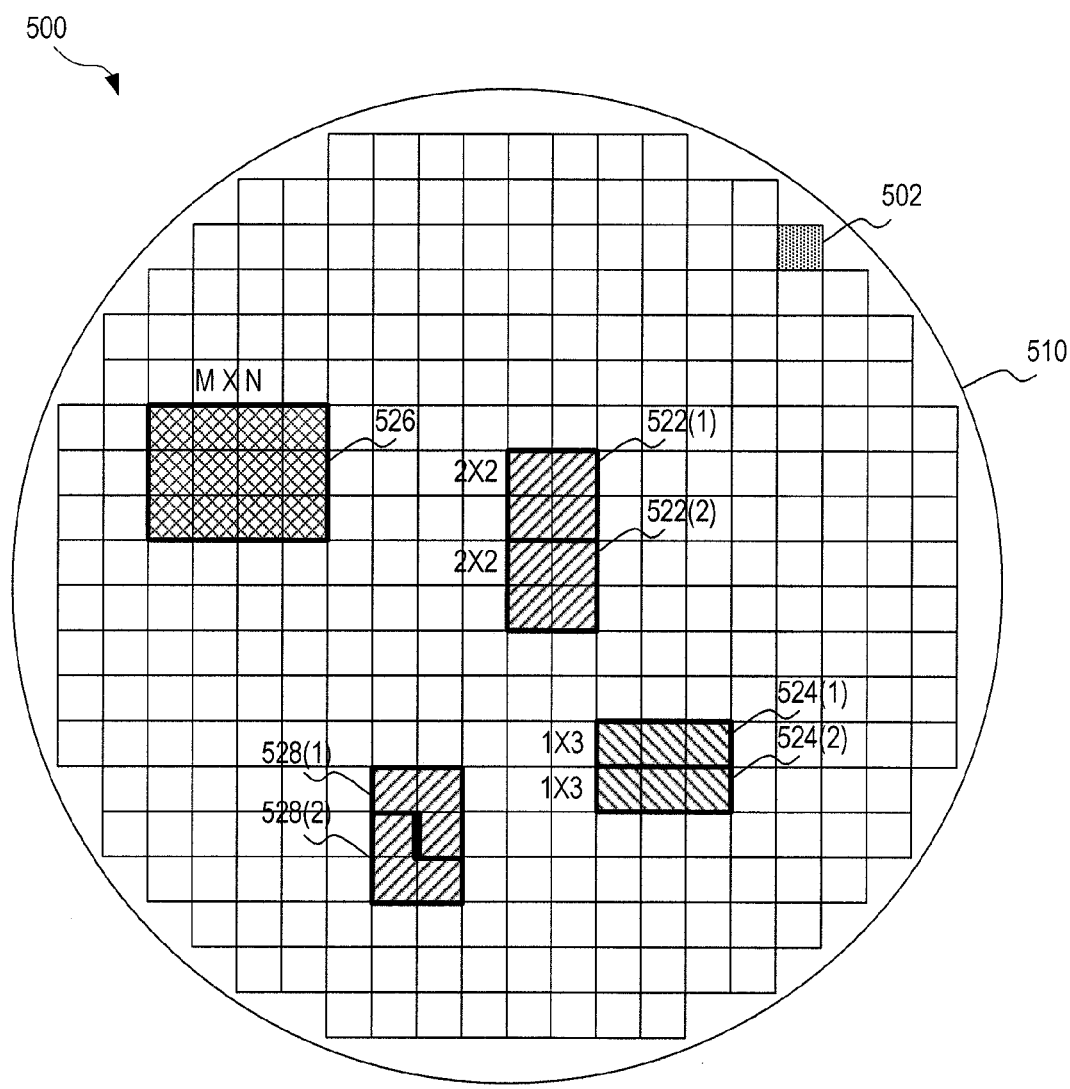
FIG. 5 illustrates a wafer configuration, according to an embodiment.

FIG. 5 illustrates one exemplary wafer configuration 500. The image sensor wafer and the lens wafer of method 400 (FIG. 4) may be configured according to wafer configuration 500, such that also the composite wafer formed in step 410 of method 400 is configured according to wafer configuration 500. For example, image sensor wafer 310, lens wafer 320, and composite wafer 300 of FIG. 3 are configured according to wafer configuration 500. Wafer configuration 500 includes elements 502 arranged along rows and columns to utilize a wafer 510. Elements 502 may represent an image sensor 115, a lens 125, or a corresponding pair thereof, of composite wafer 300 (FIG. 3).

In certain embodiments, step 440 of method 400 is performed by dicing the composite wafer along dicing lines coinciding with separation lines between elements 502. Using straight dicing lines extending from one location on the boundary of wafer 510 to another location on the boundary of wafer 510, wafer-level array cameras having M×N imaging systems may be formed, where M and N are positive integers (see label 526). In some embodiments of step 440 of method 400, the composite wafer is diced to form a plurality of identically sized wafer-level array cameras. In other embodiments of step 440, the composite wafer is diced to form a plurality of wafer-level array cameras, including differently sized wafer-level array cameras. The execution of step 440 may be simplified by segregating wafer configuration 500 into columns, where each column is intended for forming identically sized wafer-level array cameras. For example, some columns of wafer-level configuration 500 may be dedicated to the formation of wafer-level array cameras 100 (FIG. 1) of size 1×3 (see labels 524(1) and 524(2), such that wafer-level array cameras diced from these columns include three image systems, each including a lens 125 (FIG. 1) and an image sensor 115 (FIG. 1), arranged along a line. Other columns may be dedicated to the formation of wafer-level array cameras 100 (FIG. 1) of size 2×2 (see labels 522(1) and 522(2)). Furthermore, some columns may be dedicated to manufacturing of non-rectangular wafer-level array cameras 100 (FIG. 1), for example L-shaped wafer-level array cameras 100 (FIG. 1) (see labels 528(1) and 528(2).

While the rows and columns of wafer configuration 500 are orthogonal, method 400 (FIG. 4) and composite wafer 300 (FIG. 3) may be based on non-orthogonal rows and columns, without departing from the scope hereof. Further, the lens wafer and image sensor wafer of method 400 (FIG. 4), for example lens wafer 320 and image sensor wafer 310 of FIG. 3, may be configured according to wafer configuration 500, where some elements 502 are unoccupied. This may provide improved material utilization in cases where the desired wafer-level array camera sizes (M×N) do not match the shape of wafer 510. The shape of wafer 510 may deviate from the circular shape illustrated in FIG. 5, without departing from the scope hereof. For example, wafer 510 may be of rectangular shape.

Figure 6:
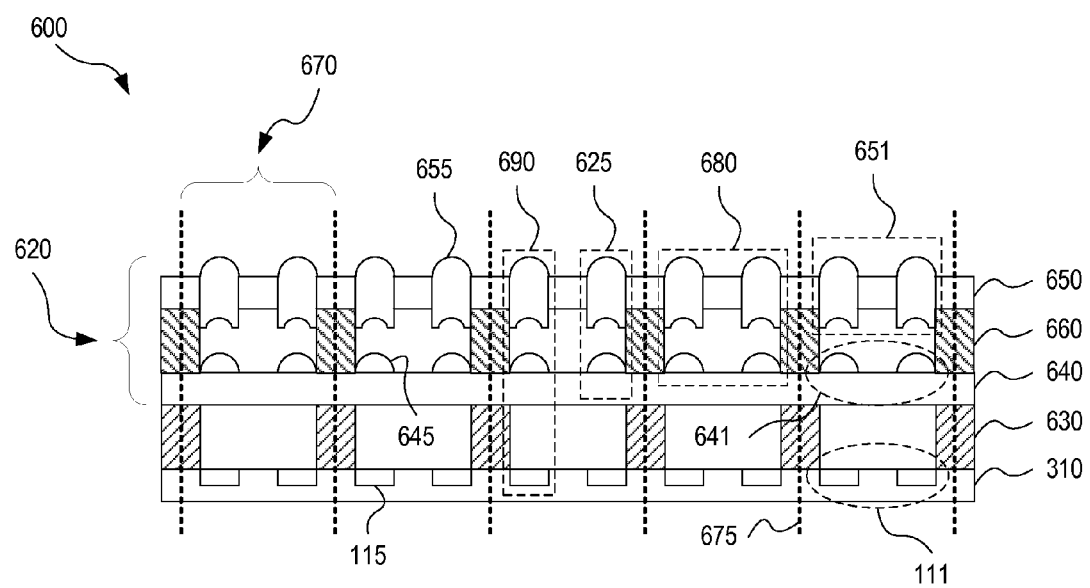
FIG. 6 illustrates a composite wafer including an image sensor wafer and a lens wafer, wherein the lens wafer includes a plurality of stacked lens sub-wafers, according to an embodiment.

FIG. 6 is a cross-sectional view of one exemplary composite wafer 600, which is an embodiment of composite wafer 300 (FIG. 3). Composite wafer 600 includes image sensor wafer 310 (FIG. 3) and a lens wafer 620 disposed on image sensor wafer 310 using a spacer 630. Spacer 630 is an embodiment of spacer 330 (FIG. 3), possibly tailored to the optical properties of composite wafer 600. For example, the thickness of spacer 630 may differ from that of spacer 330 (FIG. 3), while other properties of spacer 630 are the same as those of spacer 330. Lens wafer 620 is an embodiment of lens wafer 320 (FIG. 3), which includes two lens sub-wafers 640 and 650. Lens sub-wafer 650 is disposed on lens sub-wafer 640 using a spacer 660. Spacer 660 defines the distance between lens sub-wafers 640 and 650. Lens sub-wafer 640 includes a plurality of lens arrays 641, which in turn include a plurality of lenses 645. Similarly, lens sub-wafer 650 includes a plurality of lens arrays 651, which in turn include a plurality of lenses 655.

Lens sub-wafer 650 is aligned with respect to lens sub-wafer 640 such that at least some of lenses 655 of lens sub-wafer 650 are aligned with respective lenses 645 of lens sub-wafer 640. Such associated pairs of lens 645 and lens 655 form a stacked lens system 625. Hence, lens wafer 620 includes a plurality of stacked lenses 625, which are embodiments of lens 125 (FIG. 1). Pairs of mutually aligned lens array 641 and lens array 651 together form stacked lens arrays 680, which is an embodiment of lens array 121 (FIGS. 1 and 3). In an embodiment, the optical axis of lens 655, for at least some of lenses 655, coincides with the optical axis of a respective lens 645, to within manufacturing tolerances. For illustrative clarity, not all lenses 645 and 655, not all lens arrays 641 and 651, and not all stacked lens arrays 680 are labeled in FIG. 6.

Lens wafer 620 is aligned with respect to image sensor wafer 310 such that at least some of stacked lenses 625 are aligned with respective image sensors 115. In an embodiment, mutually aligned pairs of a stacked lens 625 and a respective image sensor 115 form imaging systems 690. For illustrative clarity, only one imaging system 690 is labeled in FIG. 6. In one embodiment, the optical axis of at least some of stacked lenses 625 intersect respective image sensors 115. In another embodiment, the optical axis of each of stacked lenses 625 intersects respective image sensors 115. In yet another embodiment, the optical axis of at least some of stacked lenses 625 is centered on respective image sensors 115.

Spacer 660 is integrally formed or formed from two or more separate elements. Although not shown in FIG. 6, spacer 660 may include material in other areas between lens sub-wafer 640 and lens sub-wafer 650. In one example, spacer 660 includes material in the region between the optical path from one lens 655 to an associated lens 645 and the optical paths from one or more adjacent lenses 655 to their associated lenses 645. In another embodiment, not illustrated in FIG. 6, spacer 660 is an integral part of lens sub-wafer 640 and/or lens sub-wafer 650. Lenses 645 and 655 may be shaped and/or sized differently from what is illustrated in FIG. 6, and further be or include other optical elements, as discussed for lenses 125, 215, 225, 235, and 245 in connection with FIGS. 1 and 2, without departing from the scope hereof.

Composite wafer 600 may be diced, or otherwise cut, along dicing lines 675 to form a plurality of wafer-level array cameras 670. Wafer-level camera 670 is an embodiment of wafer-level array camera 100 (FIG. 1), and includes an image sensor array 111, a lens array 641, and a lens array 651. For illustrative clarity, only one dicing line 675 and one wafer-level array camera 670 are labeled in FIG. 6. Dicing lines 675 may pass through material portions of spacers 630 and 660, as illustrated in FIG. 6, and/or other portions of composite wafer 600. The portion of spacer 630 included in a single wafer-level array camera 670 is an embodiment of spacer 130 (FIG. 1).

In certain embodiments, spacer 630 is configured to define a uniform distance between image sensor wafer 310 and lens wafer 620. For example, in embodiments where all stacked lenses 625, or equivalently all lenses 645, of lens wafer 620 have the same back focal length, this uniform distance may be such that the rear focal point of stacked lenses 625, or equivalently lenses 645, coincides with the light receiving surface of corresponding image sensors 115 of image sensor wafer 310. Similarly, in certain embodiments, spacer 660 is configured to provide a uniform distance between lens sub-wafers 640 and 650.

Although FIG. 6 shows five wafer-level array cameras 670, composite wafer 600 may be shaped and sized for forming a different number of wafer-level array cameras 670, without departing from the cross sectional view of FIG. 6. For example, the cross sectional view of FIG. 6 may represent a composite wafer 600 for forming 5×N' wafer-level array cameras 670, where N' is a positive integer. Generally, composite wafer 600 may be configured for forming M' wafer-level array cameras 670, where M' is a positive integer, without departing from the scope hereof. In the special case, where M' is one, dicing lines 675 may be omitted. Furthermore, wafer-level array camera 670 may be configured with a different number of image sensors 115 and associated stacked lenses 625 than shown in FIG. 6, without departing from the scope hereof.

In one embodiment, the plurality of image sensor arrays 111, the plurality of lens arrays 641, and the plurality of lens arrays 651 are arranged along rows and columns. This enables straight dicing lines 675 for forming wafer-level array cameras 670. For example, the plurality of image sensor arrays 111, the plurality of lens arrays 641, and the plurality of lens arrays 651 are arranged along orthogonal rows and columns, and dicing lines 675 are orthogonal dicing lines. In certain embodiments, lenses 645 of lens sub-wafer 640 and lenses 655 of lens sub-wafer 650 are arranged in the same pattern as respective image sensors 115 of image sensor wafer 310.

In one embodiment, all lenses 655 are identical. In another embodiment, lenses 655 includes lenses of different types.

Figure 7:
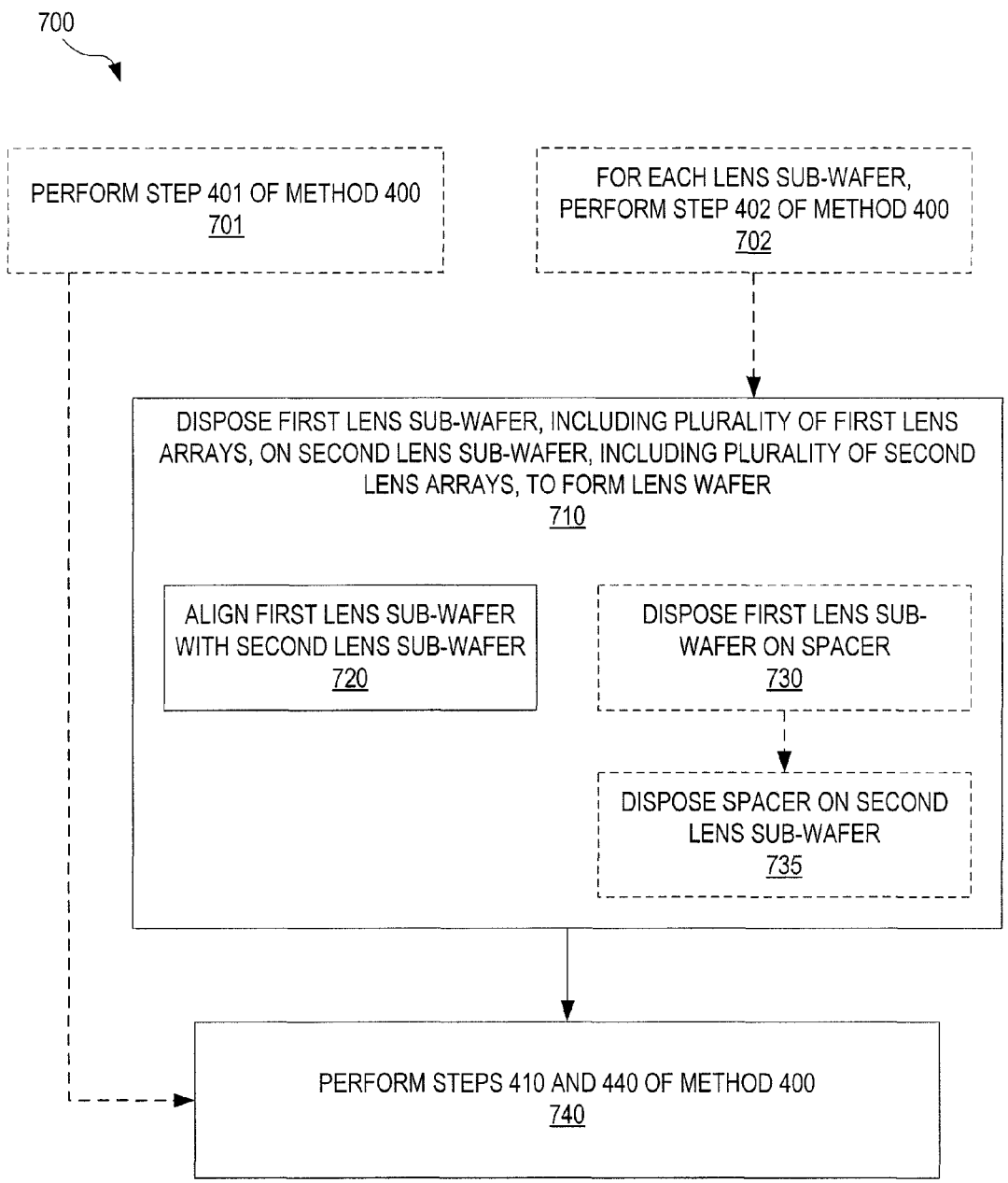
FIG. 7 illustrates a method for manufacturing a plurality of wafer-level array cameras having stacked lenses, according to an embodiment.

FIG. 7 illustrates one exemplary method 700 for manufacturing a plurality of wafer-level array cameras having stacked lenses, such as wafer-level array camera 670 of FIG. 6. In a step 710, a first lens sub-wafer, including a plurality of first lens arrays, is disposed on a second lens sub-wafer, including a plurality of second lens arrays, to form a lens wafer. For example, lens sub-wafer 650 (FIG. 6) is disposed on lens sub-wafer 640 (FIG. 6) to form lens wafer 620 (FIG. 6). Step 710 includes a step 720, wherein the first lens sub-wafer is aligned with the second lens sub-wafer. For example, in the process of disposing lens sub-wafer 650 (FIG. 6) on the second lens sub-wafer 640 (FIG. 6), lens sub-wafer 650 is aligned such the positions of lenses 655 in the plane of composite wafer 600 are substantially identical to the positions of respective lenses 645, to within manufacturing tolerances.

Step 710 may further include a step 730 of disposing the lens wafer on a spacer, followed by a step 735 of disposing the spacer on the image sensor wafer. For example, lens sub-wafer 650 (FIG. 6) is disposed on spacer 660 (FIG. 6), which is then disposed on lens sub-wafer 640 (FIG. 6). The order of steps 730 and 735 may be reversed, without departing from the scope hereof.

In a step 740, method 700 sequentially performs steps 410 and 440 of method 400 (FIG. 4) to dispose the lens wafer formed in step 710 on an image sensor wafer, and dice the resulting composite wafer to form a plurality of wafer-level array cameras. For example, lens wafer 620 (FIG. 6) is disposed on image sensor wafer 310 (FIGS. 3 and 6) to form composite wafer 600 of FIG. 6. Subsequently, composite wafer 600 is diced along dicing lines 675 to form a plurality of wafer-level array cameras 670 (FIG. 6), as indicated in FIG. 6.

Optionally, method 700 includes steps 701 and/or 702. Optional step 701 is performed prior to step 740, and optional step 702 is performed prior to step 710. In optional step 701, method 700 performs step 401 of method 400 (FIG. 4) as discussed in connection with FIG. 4. In optional step 702, method 700 performs step 402 of method 400 (FIG. 4) as discussed in connection with FIG. 4, for each lens sub-wafer used in step 710.

Figure 8:
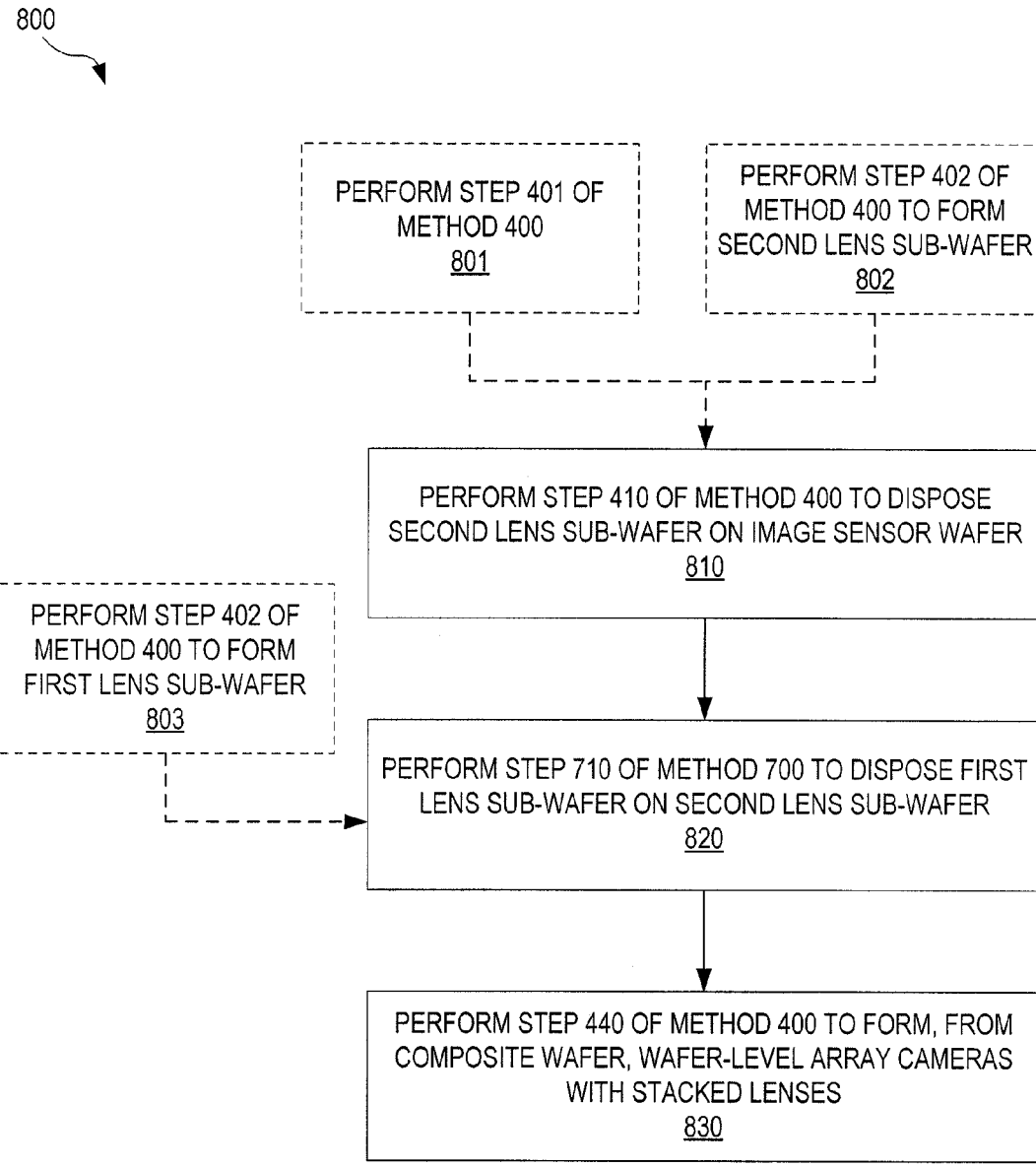
FIG. 8 illustrates another method for manufacturing a plurality of wafer-level array cameras having stacked lenses, according to an embodiment.

FIG. 8 illustrates one exemplary method 800 for manufacturing a plurality of wafer-level array cameras having stacked lenses, such as wafer-level array camera 670 (FIG. 6). In a step 810, method 800 first performs step 410 of method 400 (FIG. 4) to dispose a second lens sub-wafer on an image sensor wafer. For example, lens sub-wafer 640 (FIG. 6) is disposed on image sensor wafer 310 (FIGS. 3 and 6). In a step 820, method 800 performs step 710 of method 700 (FIG. 7) to dispose a first lens sub-wafer on the second lens sub-wafer. This results in the formation of a composite wafer including an image sensor wafer and a lens wafer, where the lens wafer includes two lens sub-wafers. For example, lens sub-wafer 650 (FIG. 6) is disposed on lens sub-wafer 640 (FIG. 6), using spacer 660, to form lens wafer 620. In a step 830, method 800 performs step 440 of method 400 (FIG. 4) to form wafer-level array cameras by dicing the composite wafer formed by performing steps 810 and 820. For example, composite wafer 600 (FIG. 6) is diced along dicing lines 675 to form a plurality of wafer-level array cameras 670 with stacked lenses 625.

Optionally, method 800 includes one or more of steps 801, 802, and 803. Optional steps 801 and 802 are performed prior to step 810, and optional step 803 is performed prior to step 820. In optional step 801, method 800 performs step 401 of method 400 (FIG. 4), as discussed in connection with FIG. 4. In optional step 802, method 800 performs step 402 of method 400 (FIG. 4), as discussed in connection with FIG. 4, to form the second lens sub-wafer. In optional step 803, method 800 performs step 402 of method 400 (FIG. 4), as discussed in connection with FIG. 4, to form the first lens sub-wafer.

Figure 9:
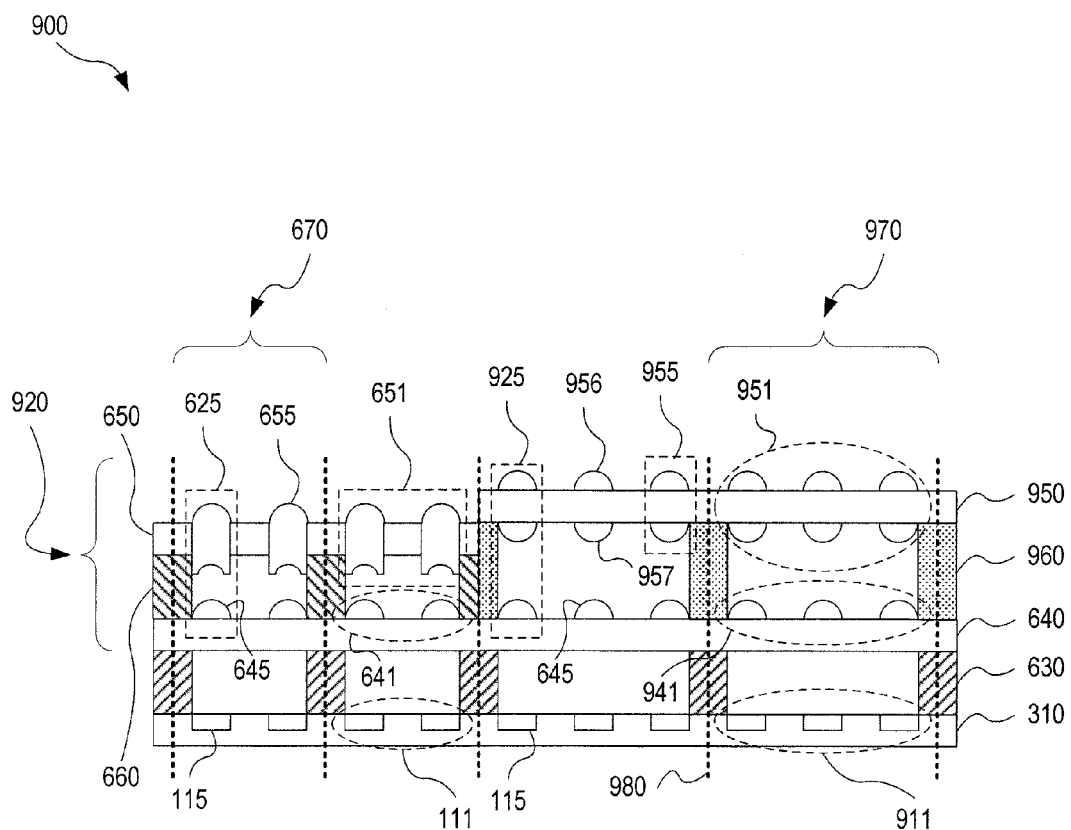
FIG. 9 illustrates a composite wafer including an image sensor wafer and a lens wafer, wherein the lens wafer includes a plurality of differently configured portions, according to an embodiment.

FIG. 9 is a cross sectional view of one exemplary composite wafer 900 for forming a plurality of wafer-level array cameras, including wafer-level array cameras of different configurations. Composite wafer 900 is an embodiment of composite wafer 300 (FIG. 3). Composite wafer 900 is an extension of composite wafer 600 (FIG. 6), wherein a single lens sub-wafer 650 is replaced by two lens sub-wafers 650 and 950, each associated with a different portion of lens sub-wafer 640 and placed at different distances from lens sub-wafer 640. Composite wafer 900 includes image sensor wafer 310 (FIG. 3) and a lens wafer 920 disposed thereon using spacer 630 (FIG. 6). Lens wafer 920 is an embodiment of lens wafer 320 (FIG. 3).

Lens wafer 920 includes lens sub-wafer 640 (FIG. 6), disposed on spacer 630. Lens sub-wafer 650 (FIG. 6) is disposed on a portion of lens sub-wafer 640 using spacer 660 (FIG. 6). This portion of composite wafer 900 is identical to composite wafer 600 (FIG. 6), except for a possible size difference. Lens sub-wafer 950 is disposed on another portion of lens sub-wafer 640 using a spacer 960. Lens sub-wafer 950 includes a plurality of lens arrays 951, which in turn includes a plurality of lenses 955. In the embodiment illustrated in FIG. 9, each lens 955 includes two lenses 956 and 957. Lens sub-wafer 950 is aligned with respect to lens sub-wafer 640 such that a least some of lenses 955 are aligned with respective lenses 645 to form stacked lenses 925, and stacked lens arrays (not labeled in FIG. 9, for illustrative clarity) are formed from pairs of mutually aligned lens arrays 941 and 951. For illustrative clarity, only one of each of lenses 955, 956, 957, lens stacks 925, and lens arrays 951 are labeled in FIG. 9.

Lens wafer 920 is aligned with respect to image sensor wafer 310 such that at least some of stacked lenses 625 and 925 are aligned with respective image sensors 115. In an embodiment, mutually aligned pairs of a attacked lens 625, or a stacked lens 925, and a respective image sensor 115 form imaging systems (not labeled in FIG. 9, for illustrative clarity). In one embodiment, the optical axis of at least some of stacked lenses 625 and/or 925 intersect respective image sensors 115. In another embodiment, the optical axis of each of stacked lenses 625 and 925 intersect respective image sensors 115. In yet another embodiment, the optical axis of at least some of stacked lenses 625 and/or 925 is centered on respective image sensors 115.

Composite wafer 900 may be diced, or otherwise cut, along dicing lines 980 to form a plurality of wafer-level array cameras 670 and 970. Wafer-level array camera 970 is an embodiment of wafer-level array camera 100 (FIG. 1). Wafer-level array camera 970 is identical to wafer-level array camera 670 (FIG. 6) except for (a) a possible size difference, i.e., having fewer or more imaging systems, and (b) lens array 650 and spacer 660 being replaced by lens array 950 and spacer 960. For illustrative clarity, only one dicing line 980, one wafer-level array camera 670, and one wafer-level camera 970 are labeled in FIG. 6. Dicing lines 980 may pass through material portions of spacers 630 and 660 or 960, as illustrated in FIG. 9, and/or other portions of composite wafer 900.

In certain embodiments, spacer 630 is configured to define a uniform distance between lens wafer 920 and image sensor wafer 310. For example, in embodiments where all lenses 645 of lens sub-wafer 640 have the same back focal length, this uniform distance may be such that the rear focal point of stacked lenses 625 and stacked lenses 925, or equivalently lenses 645, coincides with the light receiving surface of corresponding image sensors 115 of image sensor wafer 310. Similarly, in certain embodiments, spacer 960 is configured to provide a uniform distance between lens sub-wafers 640 and 950, and/or spacer 660 is configured to provide a uniform distance between lens sub wafers 640 and 650.

Although FIG. 9 shows two wafer-level array cameras 670 and two wafer-level array cameras 970, composite wafer 900 may be shaped and sized for forming a different number of wafer-level array cameras 670 and 970, without departing from the cross sectional view of FIG. 9. For example, the cross sectional view of FIG. 9 may represent a composite wafer 900 for forming 2×N1 wafer-level array cameras 670 and 2×N2 wafer-level array cameras, where N1 and N2 are positive integers. Generally, composite wafer 900 may be configured for forming M1 wafer-level array cameras 670 and M2 wafer-level array cameras 970, where M1 and M2 are positive integers, without departing from the scope hereof. Furthermore, wafer-level array camera 670 may be configured with a different number of image sensors 115 and associated stacked lenses 625 than shown in FIG. 9, without departing from the scope hereof. Likewise, wafer-level array camera 970 may be configured with a different number of image sensors 115 and associated stacked lenses 925 than shown in FIG. 9, without departing from the scope hereof.

In one embodiment, the plurality of image sensor arrays 111, the plurality of lens arrays 641, the plurality of lens arrays 651, and the plurality of lens array 951 are arranged along rows and columns. This enables straight dicing lines 980 for forming wafer-level array cameras 670 and 970. For example, the plurality of image sensor arrays 111, the plurality of lens arrays 641, the plurality of lens arrays 651, and the plurality of lens arrays 951 are arranged along orthogonal rows and columns, and dicing lines 980 are orthogonal dicing lines. In certain embodiments, lenses 645 of lens sub-wafer 640, lenses 655 of lens sub-wafer 650, and lenses 955 of lens sub-wafer 950 are arranged in the same pattern as respective image sensors 115 of image sensor wafer 310.

Spacer 960 is integrally formed or formed from two or more separate elements. Although not shown in FIG. 9, spacer 960 may include material in other areas between lens sub-wafer 640 and lens sub-wafer 950. In one example, spacer 960 includes material in the region between the optical path from one lens 955 to an associated lens 645 and the optical paths from one or more adjacent lenses 955 to their associated lenses 645. In another embodiment, not illustrated in FIG. 9, spacer 960 is an integral part of lens sub-wafer 640 and/or lens sub-wafer 950. In certain embodiments, spacers 660 and 960 are integrally formed. In other embodiments, spacers 660 and 960 are formed separately from each other.

Lenses 645, 655, and 955 may be shaped and/or sized differently from what is illustrated in FIG. 9, and further be or include other optical elements, as discussed for lenses 125, 215, 225, 235, and 245 in connection with FIGS. 1 and 2, without departing from the scope hereof. In one embodiment, all lenses 955 are identical. In another embodiment, lenses 955 includes lenses of different types.

According to the illustration of FIG. 9, wafer-level array cameras 970 differ from wafer-level array cameras 670 in size, i.e., the number of imaging systems included in one wafer-level array camera, and in optical properties. For example, lenses 955 may have different focal length from lenses 655. Other examples of differences in optical properties include clear aperture, aberration properties, collection efficiency, material, size, shape, light transmission, and combinations thereof. Alternately, composite wafer 900 may be configured with more and/or other different types of lens sub-wafers 950 and spacers 960, without departing from the scope hereof. Composite wafer 900, as illustrated in FIG. 9, is a non-limiting example of composite wafers, having two or more different lens wafers disposed on different portions of an image sensor wafer, for forming wafer-level array cameras of two or more different types. Other configurations of composite wafer 900 include, for example, a single-wafer lens wafer being disposed on one portion of image sensor wafer 310 and a lens wafer, having multiple stacked sub-wafers, being disposed on another portion of image sensor wafer 310.

Figure 10:
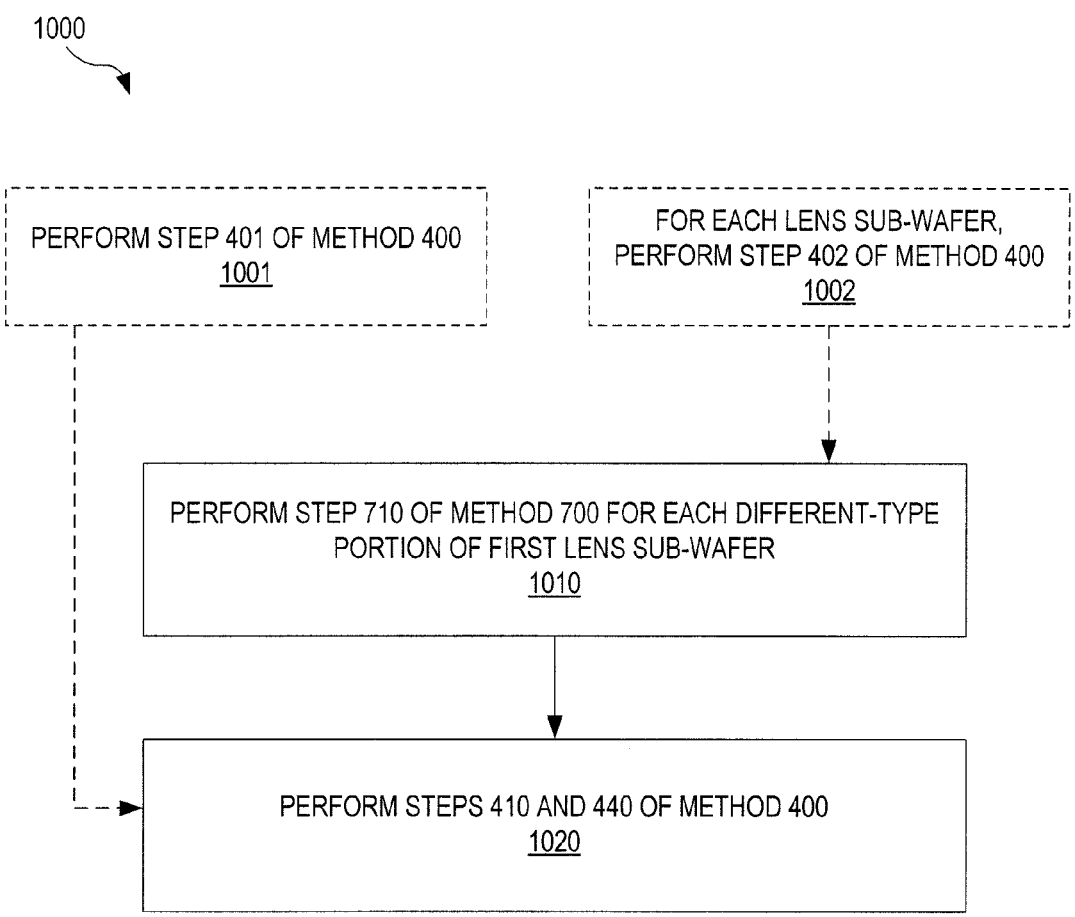
FIG. 10 illustrates a method for manufacturing a plurality of wafer-level array cameras, including a plurality of different types of wafer-level array cameras, from a single composite wafer, according to an embodiment.

FIG. 10 illustrates one exemplary method 1000 for manufacturing a plurality of wafer-level array cameras of at least two different types, such as wafer-level array camera 670 (FIGS. 6 and 9) and wafer-level array camera 970 (FIG. 9), from a single composite wafer. In a step 1010, method 1000 performs step 710 of method 700 (FIG. 7) for each different-type portion of a first lens sub-wafer, to form a lens wafer. For example, lens sub-wafer 650 (FIGS. 6 and 9) and lens sub-wafer 950 (FIG. 9) are disposed on lens sub-wafer 640 (FIGS. 6 and 9) to form lens wafer 920 (FIG. 9), as discussed for lens sub-wafer 650 in connection with FIG. 7.

In a step 1020, method 1000 sequentially performs steps 410 and 440 of method 400 (FIG. 4) to dispose the lens wafer formed in step 1010 on an image sensor wafer, and dice the resulting composite wafer to form a plurality of wafer-level array cameras. For example, lens wafer 920 (FIG. 9) is disposed on image sensor wafer 310 (FIGS. 3 and 9) to form composite wafer 900 of FIG. 9. Subsequently, composite wafer 900 is diced along dicing lines 980 to form a plurality of wafer-level array cameras 670 (FIGS. 6 and 9) and 970 (FIG. 9), as indicated in FIG. 9.

Optionally, method 1000 further includes steps 1001 and 1002. Optional step 1001 is performed before step 1020, and optional step 1002 is performed before step 1010. In optional step 1001, method 1000 performs step 401 of method 400 (FIG. 4). In optional step 1002, method 1000 performs step 402 or method 400 (FIG. 4), as discussed in connection with FIG. 4, for each lens sub-wafer used in step 1010.

Figure 11:
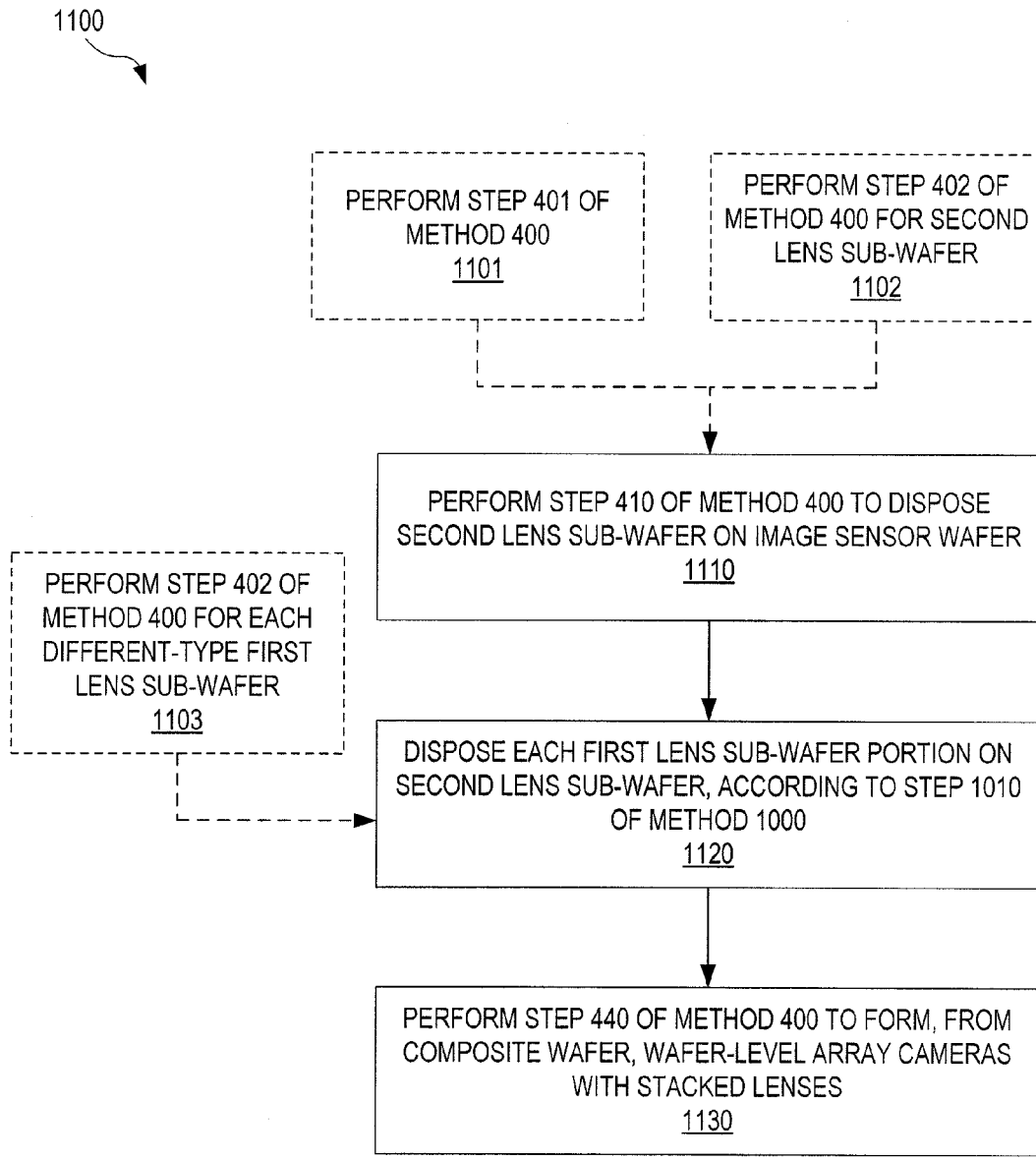
FIG. 11 illustrates another method for manufacturing a plurality of wafer-level array cameras, including a plurality of different types of wafer-level array cameras, from a single composite wafer, according to an embodiment.

FIG. 11 illustrates one exemplary method 1100 for manufacturing a plurality of wafer-level array cameras of at least two different types, such as wafer-level array camera 670 (FIGS. 6 and 9) and wafer-level array camera 970 (FIG. 9), from a single composite wafer. In a step 1110, method 1100 first performs step 410 of method 400 (FIG. 4) to dispose a second lens sub-wafer on an image sensor wafer. For example, lens sub-wafer 640 (FIGS. 6 and 9) is disposed on image sensor wafer 310 (FIGS. 3 and 9). In a step 1120, method 1100 performs step 1010 of method 1000 (FIG. 10) to dispose two or more first lens sub-wafer portions of different types on the second lens sub-wafer. This results in the formation of a composite wafer including an image sensor wafer and a lens wafer, where the lens wafer includes two lens sub-wafers, and where the lens wafer includes at least two portions of different configurations. For example, lens sub-wafers 650 (FIGS. 6 and 9) and 950 (FIG. 9) are disposed on different portions of lens sub-wafer 640 (FIGS. 6 and 9), using spacers 660 and 960 respectively, to form lens wafer 920. In a step 1130, method 1100 performs step 440 of method 400 (FIG. 4) to form wafer-level array cameras by dicing the composite wafer formed by performing steps 1110 and 1120. For example, composite wafer 900 (FIG. 9) is diced along dicing lines 980 to form a plurality of wafer-level array cameras 670 (FIGS. 6 and 9) and 970 (FIG. 9).

Optionally, method 1100 includes one or more of steps 1101, 1102, and 1103. Optional steps 1101 and 1102 are performed prior to step 1110, and optional step 1103 is performed prior to step 1120. In optional step 1101, method 1100 performs step 401 of method 400 (FIG. 4), as discussed in connection with FIG. 4. In optional step 1102, method 1100 performs step 402 of method 400 (FIG. 4), as discussed in connection with FIG. 4, to form the second lens sub-wafer. In optional step 1103, method 1100 performs step 402 of method 400 (FIG. 4), for each different-type portion of the first lens sub-wafer, as discussed in connection with FIG. 4, to form each portion of the first lens sub-wafer. For example, lens sub-wafers 650 (FIGS. 6 and 9) and 950 (FIG. 9) are formed.

Composite wafers 600 (FIG. 6) and 900 (FIG. 9), wafer-level array cameras 670 (FIGS. 6 and 9) and 970 (FIG. 9), and methods 700 (FIG. 7), 800 (FIG. 8), 1000 (FIG. 10), and 1100 (FIG. 11) may be extended to include more than two lens sub-wafers forming individual wafer-level layers of a lens wafer. In general terms, composite wafers 600 (FIG. 6) and 900 (FIG. 9), wafer-level array cameras 670 (FIGS. 6 and 9) and 970 (FIG. 9), and methods 700 (FIG. 7), 800 (FIG. 8), 1000 (FIG. 10), and 1100 (FIG. 11) may be extended to include N lens sub-wafers, where N is a positive integer, such that the lens wafer includes N stacked lens sub-wafers, without departing from the scope hereof.

Combinations of Features

Features described above as well as those claimed below may be combined in various ways without departing from the scope hereof. For example, it will be appreciated that aspects of one wafer-level array camera, or method for fabricating the same, described herein may incorporate or swap features of another wafer-level array camera, or method for fabricating the same, described herein. The following examples illustrate possible, non-limiting combinations of embodiments described above. It should be clear that many other changes and modifications may be made to the methods and device herein without departing from the spirit and scope of this invention:

(A) A wafer-level array camera may include (i) an image sensor wafer that includes an image sensor array and (ii) a lens wafer that includes a lens array.

(B) The wafer-level array camera denoted as (A) may further include a spacer disposed on the image sensor wafer, and the lens wafer may be disposed on the spacer.

(C) In the wafer-level array cameras denoted as (A) and (B), the lens array may be disposed such that each lens of the lens array together with a respective image sensor of the image sensor array forms an imaging system.

(D) In the wafer-level array cameras denoted as (A) through (C), each lens of the lens wafer may have the same back focal length.

(E) In the wafer-level array cameras denoted as (A) through (D), each lens of the lens wafer may be disposed at the same distance from a respective image sensor of the image sensor wafer.

(F) In the wafer-level array cameras denoted as (A) through (E), the lens wafer may include a plurality of lens sub-wafers.

(G) In the wafer-level array camera denoted as (F), each image sensor of the image sensor array together with a respective lens from each of the plurality of lens sub-wafers may form an imaging system with a stacked lens system.

(H) In the wafer-level array cameras denoted as (F) and (G), the plurality of lens sub-wafers may include a first lens sub-wafer and one or more additional lens sub-wafers, wherein the first lens sub-wafer is disposed between the one or more additional lens sub-wafers and the image sensor wafer, and wherein all lenses of the first lens sub-wafer having same back focal length.

(I) A method for fabricating a plurality of wafer-level array cameras may include disposing a lens wafer, which includes a plurality of lens arrays, on an image sensor wafer, which includes a plurality of image sensor arrays, to form a composite wafer.

(J) The method denoted as (I) may further include dicing the composite wafer to form the plurality of wafer-level array cameras, wherein each of the plurality of wafer-level array cameras includes a respective one of the plurality of lens arrays and a respective one of the plurality of image sensor arrays.

(K) In the methods denoted as (I) and (J), all lenses of the plurality of lens arrays may have the same back focal length.

(L) In the methods denoted as (I) through (K), the step of disposing a lens wafer may include aligning the lens wafer with the image sensor wafer.

(M) In the method denoted as (L) the step of aligning the lens wafer with the image sensor wafer may include aligning lens wafer with the image sensor wafer such that lenses of the plurality of lens arrays are aligned with respective image sensors of the plurality of image sensor arrays.

(N) In the methods denoted as (I) through (M), the step of disposing a lens wafer may include disposing the lens wafer on a spacer and disposing the spacer on the image sensor wafer.

(O) In the methods denoted as (J) through (N), the step of dicing the composite wafer may further include dicing the composite wafer along at least one dicing line that intersects a material portion of the spacer.

(P) In the methods denoted as (I) through (O), the distance between the lens wafer and the image sensor wafer of the composite wafer, in a direction orthogonal to the image sensor wafer, may be substantially uniform.

(Q) The methods denoted as (I) through (P) may further include forming the lens wafer by disposing a first lens sub-wafer, including a plurality of first lens arrays, on a second lens sub-wafer, including a plurality of second lens arrays.

(R) In the method denoted as (Q), the first lens sub-wafer may be disposed on the second lens sub-wafer such that each lens of the first lens array and a respective lens of the second lens array together form a stacked lens system.

(S) In the methods denoted as (Q) and (R), all lenses of the plurality of second lens arrays may have the same back focal length.

(T) In the methods denoted as (Q) through (S), the step of disposing a lens wafer may include disposing the lens wafer with the second lens sub-wafer facing the image sensor wafer.

(U) In the methods denoted as (Q) through (T), at least one of the plurality of first lens arrays may have back focal length different from lenses of other ones of the plurality of first lens arrays.

(V) The methods denoted as (I) through (P) may include forming the lens array by stacking a plurality of lens sub-wafers such that each lens of the plurality of lens arrays is a stacked lens system.

(W) The methods denoted as (I) through (P) may include forming the lens wafer by disposing a plurality of first lens sub-wafers, each including a plurality of first lens arrays and wherein the plurality of first lens arrays of one first lens sub-wafer is different from the plurality of first lens arrays of at least one other first lens sub-wafer, on a second lens sub-wafer, including a plurality of second lens arrays.

(X) In the method denoted as (W), the plurality of first lens sub-wafers may be disposed on the second sub-lens wafer such that each lens of the first lens arrays and a respective lens of the second lens array together form a stacked lens system.

(Y) In the methods denoted as (W) and (X), all lenses of the plurality of second lens arrays may have the same back focal length.

(Z) In the methods denoted as (W) through (Y), the step of disposing a lens wafer may include disposing the lens wafer with the second lens sub-wafer facing the image sensor wafer.

(AA) In the methods denoted as (W) through (Z), the plurality of first lens arrays of one first lens sub-wafer may have focal length different from the plurality of first lens arrays of at least one other first lens sub-wafer.

(AB) In the methods denoted as (I) through (AA), the step of dicing the composite wafer may further include dicing the composite wafer according to sizes of the wafer-level array cameras.

(AC) In the methods denoted as (I) through (AB), the step of dicing the composite wafer may further include dicing the composite wafer such that wafer-level array cameras of different sizes are associated with different columns of the composite wafer.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and device, which, as a matter of language, might be said to fall therebetween.

What is claimed is:

1. A method for fabricating a plurality of wafer-level array cameras, comprising:
    disposing a lens wafer, including a plurality of lens arrays, on an image sensor wafer, including a plurality of image sensor arrays, to form a composite wafer; and
    dicing the composite wafer to form the wafer-level array cameras, each of the wafer-level array cameras comprising a respective one of the lens arrays and a respective one of the image sensor arrays;
    wherein all lenses of the lens arrays have same back focal length;
    wherein the step of dicing comprises dicing the composite wafer to produce wafer-level array cameras of different array sizes; and
    wherein the step of disposing a lens wafer comprises a single step of aligning the lens wafer with the image sensor wafer such that all lenses of the lens arrays are aligned with respective image sensors of the image sensor arrays.

2. The method of claim 1, the step of disposing a lens wafer comprising:
    disposing the lens wafer on a spacer; and
    disposing the spacer on the image sensor wafer.

3. The method of claim 2, the step of dicing the composite wafer further comprising dicing the composite wafer along at least one dicing line that intersects a material portion of the spacer.

4. The method of claim 2, the distance between the lens wafer and the image sensor wafer of the composite wafer, in a direction orthogonal to the image sensor wafer, being substantially uniform.

5. The method of claim 1, further comprising forming the lens wafer by disposing a first lens sub-wafer, including a plurality of first lens arrays, on a second lens sub-wafer, including a plurality of second lens arrays, such that each lens of the first lens arrays and a respective lens of the second lens arrays together form a stacked lens system.

6. The method of claim 5, all lenses of the second lens arrays having same back focal length, and the step of disposing a lens wafer comprising disposing the lens wafer with the second lens sub-wafer facing the image sensor wafer.

7. The method of claim 5, lenses of at least one of the first lens arrays having back focal length different from lenses of other ones of the first lens arrays.

8. The method of claim 1, further comprising forming the lens array by stacking a plurality of lens sub-wafers such that each lens of the lens arrays is a stacked lens system.

9. The method of claim 1, the step of dicing the composite wafer further comprising dicing the composite wafer such that wafer-level array cameras of different array sizes are associated with different respective columns of the composite wafer.

10. The method of claim 1, further comprising forming the lens wafer by disposing (a) a plurality of first lens sub-wafers each including a plurality of first lens arrays on (b) a second lens sub-wafer including a plurality of second lens arrays, such that each lens of the first lens arrays and a respective lens of the second lens array together form a two-layer stacked lens system and such that the first lens arrays cooperate with second lens arrays to form respective two-layer lens array stacks, each of the first lens arrays of one first lens sub-wafer being non-identical to each of the first lens arrays of at least one other first lens sub-wafer.

11. The method of claim 10, all lenses of the second lens arrays having same back focal length, and the step of disposing a lens wafer comprising disposing the lens wafer with the second lens sub-wafer facing the image sensor wafer.

12. The method of claim 10, wherein lenses of the first lens arrays of one first lens sub-wafer have focal length different from lenses of the first lens arrays of at least one other first lens sub-wafer.

13. A method for fabricating a plurality of wafer-level array cameras, comprising:
 forming a lens wafer by disposing (a) a plurality of first lens sub-wafers including a plurality of first lens arrays on (b) a second lens sub-wafer including a plurality of second lens arrays, such that each lens of the first lens arrays and a respective lens of the second lens arrays together form a two-layer stacked lens system and such that the first lens arrays cooperate with second lens arrays to form respective two-layer lens array stacks, each two-layer stacked lens system having same back focal length;
 disposing the lens wafer on an image sensor wafer, including a plurality of image sensor arrays, to form a composite wafer; and
 dicing the composite wafer to form the plurality of wafer-level array cameras, each of the wafer-level array cameras comprising a respective one of the two-layer lens array stacks and a respective one of the image sensor arrays, at least one wafer-level array camera having first lens array non-identical to first lens array of another one wafer-level array camera;
 wherein the step of disposing a lens wafer comprises a single step of aligning the lens wafer with the image sensor wafer such that each two-layer stacked lens system of the two-layer lens array stacks is aligned with a respective image sensor of the image sensor arrays.

14. The method of claim 13, lenses of each of the first lens arrays of one first lens sub-wafer having focal length different from lenses of each of the first lens arrays of at least one other first lens sub-wafer.

15. The method of claim 13, all lenses of the plurality of second lens arrays having same back focal length, and the step of disposing a lens wafer comprising disposing the lens wafer with the second lens sub-wafer facing the image sensor wafer.

16. The method of claim 13, for each individual one of the first lens arrays, all lenses of the individual one of the first lens arrays being identical to each other.

17. The method of claim 13, the step of disposing a lens wafer comprising:
 disposing the lens wafer on a spacer; and
 disposing the spacer on the image sensor wafer.

18. The method of claim 13, the step of dicing the composite wafer further comprising dicing the composite wafer to produce wafer-level array cameras of different array sizes.

19. The method of claim 18, the step of dicing the composite wafer further comprising dicing the composite wafer such that wafer-level array cameras of different array sizes are associated with different respective columns of the composite wafer.

20. The method of claim 13, array size of all the image sensor arrays being identical.

* * * * *